(12) United States Patent
Vanderveen et al.

(10) Patent No.: US 8,310,832 B2
(45) Date of Patent: Nov. 13, 2012

(54) SIDE-EXHAUST COOLING SYSTEM FOR RACK MOUNTED EQUIPMENT

(75) Inventors: Anthony Siebe Vanderveen, San Jose, CA (US); Daniel Kiernan Kilkenny, Pleansnton, CA (US)

(73) Assignee: Brocade Communications Systems, Inc., San Jose, CA (US)

( * ) Notice: Subject to any disclaimer, the term of this patent is extended or adjusted under 35 U.S.C. 154(b) by 340 days.

(21) Appl. No.: 12/485,420

(22) Filed: Jun. 16, 2009

(65) Prior Publication Data

US 2010/0315788 A1   Dec. 16, 2010

(51) Int. Cl.
*H05K 5/00* (2006.01)
*H05K 7/20* (2006.01)
*H01J 5/00* (2006.01)
*G06F 1/20* (2006.01)

(52) U.S. Cl. ... 361/724; 361/752; 361/725; 361/679.46; 361/692; 361/679.49; 454/184; 174/50

(58) Field of Classification Search ............. 361/724, 361/752, 692, 725, 679.46, 679.49; 454/184; 174/50
See application file for complete search history.

(56) References Cited

U.S. PATENT DOCUMENTS

| | | | |
|---|---|---|---|
| 3,192,306 A | 6/1965 | Skonnord | |
| 6,269,959 B1 * | 8/2001 | Haworth | 211/26 |
| 6,305,556 B1 * | 10/2001 | Mayer | 211/26 |
| 6,463,997 B1 * | 10/2002 | Nicolai et al. | 165/80.2 |
| 6,574,100 B1 * | 6/2003 | Anderson | 361/679.5 |
| 6,578,939 B1 * | 6/2003 | Mayer | 312/334.5 |
| 6,611,428 B1 * | 8/2003 | Wong | 361/695 |
| 6,675,976 B2 * | 1/2004 | Steinman et al. | 211/26 |
| 6,877,551 B2 * | 4/2005 | Stoller | 165/47 |
| 7,033,267 B2 * | 4/2006 | Rasmussen | 454/184 |
| 7,088,583 B2 * | 8/2006 | Brandon et al. | 361/694 |
| 7,112,131 B2 * | 9/2006 | Rasmussen et al. | 454/184 |
| 7,113,401 B2 * | 9/2006 | Becker et al. | 361/694 |
| 7,182,208 B2 * | 2/2007 | Tachibana | 211/26 |
| 7,184,267 B2 | 2/2007 | Patel | |
| 7,206,201 B2 * | 4/2007 | Behl et al. | 361/679.48 |
| 7,218,526 B2 * | 5/2007 | Mayer | 361/725 |
| 7,280,356 B2 * | 10/2007 | Pfahnl et al. | 361/695 |
| 7,403,391 B2 * | 7/2008 | Germagian et al. | 361/695 |
| 7,804,684 B1 * | 9/2010 | Aybay et al. | 361/679.5 |
| 2003/0128517 A1 * | 7/2003 | Faneuf et al. | 361/704 |

(Continued)

*Primary Examiner* — Bradley Thomas
(74) *Attorney, Agent, or Firm* — Wong, Cabello, Lutsch, Rutherford & Brucculeri LLP

(57) ABSTRACT

A cooling system for rack mount electrical or electronic equipment comprises a hollow, box-shaped exhaust shelf having a vent on at least one end face thereof. The exhaust shelf may be configured for rack mounting. A side duct, open on its inner side, is mounted between the exhaust shelf and a top rail adapted to be mounted between a front post and an opposing rear post in a four-post rack mount enclosure. A plenum in the side duct is in fluid communication with the interior chamber of the exhaust shelf. A chassis having a side-facing exhaust for cooling air may be mounted on or over the exhaust shelf such that warm air exiting the chassis is collected in the plenum of the side duct and channeled into the exhaust shelf and out through the vent. In this way, the desired front-to-back cooling air flow within a rack mount enclosure may be maintained even if one or more individual chassis mounted in the enclosure have side cooling air exhausts. In other embodiments of the invention, the airflow may be in the reverse direction—i.e., cooling air may be drawn into the shelf, pass through the side duct and enter the chassis.

17 Claims, 4 Drawing Sheets

U.S. PATENT DOCUMENTS

| | | | |
|---|---|---|---|
| 2006/0087813 A1* | 4/2006 | Becker et al. | 361/694 |
| 2006/0087814 A1* | 4/2006 | Brandon et al. | 361/694 |
| 2006/0276121 A1* | 12/2006 | Rasmussen | 454/184 |
| 2008/0239659 A1 | 10/2008 | Kundapur | |
| 2008/0316702 A1* | 12/2008 | Donowho et al. | 361/692 |
| 2008/0316703 A1* | 12/2008 | Donowho et al. | 361/695 |
| 2010/0003911 A1* | 1/2010 | Graczyk et al. | 454/184 |
| 2011/0096498 A1* | 4/2011 | Tambe | 361/695 |

* cited by examiner

SIDE-EXHAUST COOLING SYSTEM FOR RACK MOUNTED EQUIPMENT

CROSS-REFERENCE TO RELATED APPLICATIONS

NONE

STATEMENT REGARDING FEDERALLY SPONSORED RESEARCH OR DEVELOPMENT

NOT APPLICABLE

BACKGROUND OF THE INVENTION

1. Field of the Invention

This invention relates to cooling systems for electrical devices. More particularly, it relates to cooling systems for rack-mounted, electronic equipment.

2. Description of the Related Art Including Information Disclosed Under 37 CFR 1.97 and 1.98

Electronic equipment housed in a chassis is often mounted in a rack enclosure. A 19-inch rack is a standardized frame or enclosure for mounting multiple electronic modules. Each module has a front panel that is 19 inches (480 mm) wide, including edges or ears that protrude on each side which allow the module to be fastened to the rack frame with machine screws, bolts or specialized fasteners.

Equipment designed to be placed in a rack is typically described as "rack-mount," a "rack mounted system," a "rack mount chassis," "subrack," "rack mountable" or, occasionally, simply "shelf." The height of the electronic modules is also standardized as multiples of 1.75 inches (44.45 mm)—one rack unit or "U". Most racks are offered in the 42U form—a single rack capable of holding forty-two 1U devices, or any combination of 1U, 2U, 3U or other rack unit heights that add up to 42 or less.

Because of their origin as mounting systems for railroad signaling relays, they are still sometimes called "relay racks," but the 19-inch rack format has remained a constant while the technology that is mounted within it has changed to completely different fields. The 19-inch standard rack arrangement is widely used throughout the telecommunication, computing, audio, entertainment and other industries, although the Western Electric 23-inch standard, with holes on 1-inch centers, prevails in telecommunications.

Racks (and rack enclosures) are widely used for computer server and network switching equipment, allowing for dense hardware configurations without occupying excessive floor space or requiring shelving. Another use for rack-mounted equipment is industrial power, control, and automation hardware, typically in 46U racks. Racks and rack enclosures are typically constructed of steel or aluminum. Certain rack-mount cases are now also constructed of thermo-stamped composites including those comprising carbon fiber and/or aramid fiber (e.g., DuPont Kevlar) for demanding military and commercial uses.

Racks are available with either four or two vertical rails or "posts." Four-post racks provide for mounting slides to support the equipment at both the front and rear. Four-post racks can also be provided with sides and front and rear doors. Two-post racks provide just two vertical rails. Equipment can be either mounted via the front panel holes or close to the center of gravity to minimize load on the front panel. Two-post racks are most often used for telecommunication installations.

Standards for a 19-inch rack are published by the Electronic Industries Alliance (EIA-310-D), Consumer Electronics Association (CEA-310-E) and the International Electrotechnical Commission Rack-mountable equipment may be mounted simply by bolting its front panel to the rack, or, in the case of a square-holed rack, by clipping or other fastening means. Having all the structural support at one edge of the equipment can be a weakness of this system, and heavier equipment may be designed to use a second pair of mounting strips located at the back of the equipment. The strength required of the mounting strips means they are typically not merely flat strips but a wider folded strip arranged around the corner of the rack. The strips are usually made of steel having a thickness of about 2 mm (one standard recommends a minimum of 1.9 mm), or of slightly thicker aluminum.

Heavy equipment or equipment which is commonly accessed for servicing, for which attaching or detaching at all four corners simultaneously would pose a problem, is often not mounted directly onto the rack but instead is mounted via rails (or slides). A pair of rails is mounted directly onto the rack, and the equipment then slides into the rack along the rails, which support it. When in place, the equipment may also then be bolted to the rack. The rails may also be able to fully support the equipment in a position where it has been slid clear of the rack; this is useful for inspection or maintenance of equipment which will then be slid back into the rack.

Rack mount enclosures typically have solid side panels and either open or mesh front and back surfaces. The mesh may be in the form of a door that opens to permit access to the equipment mounted in the rack. The mesh may be an expanded metal mesh which is bonded to the rack and/or grounded to reduce electromagnetic interference (EMI). As part of this enclosure design, cooling air is directed to flow in or out of the front and rear of the enclosure. Perhaps the most common design is configured to draw cooling air in from the front of the enclosure and exhaust heated air from the back. It should be appreciated, however, that the terms "front" and "back" are somewhat arbitrary in this context since rack mounted equipment typically can be installed with either face towards the "front" of the rack mount enclosure.

Unused vertical space in open frame rack and rack enclosures can create an unrestricted recycling of hot air that may cause equipment to overheat and malfunction. This mainly occurs when hot exhaust air returns above or below the equipment and back to the air intake ("exhaust air recirculation"). Blanking panels can be used to reduce this problem. Blanking panels fill empty vertical spaces in the rack to maintain the desired front-to-back airflow. Plastic blanking panels that snap in to any square-holed rack enclosure and that can be installed without tools are available.

Equipment rooms having a large number of rack mount enclosures—e.g., data centers, server farms, and the like—are often configured with alternating "hot" and "cold" aisles between rows of rack mount enclosures. The enclosures are positioned such that their fronts face a "cold aisle" and their rear surfaces face a "hot aisle." This enables the air handling equipment in the room to be designed such that cooled air is supplied to the cold aisles and warmed air is exhausted from the hot aisles. In some equipment rooms, the rack mount enclosures are supported on a modular, elevated floor which permits cables to be conveniently run to the enclosures. Relatively cool air can also be supplied to the cold aisles from grills located in the floor system. The entire elevated floor system may serve as a plenum for the cooler air.

It will be appreciated that, in such a system, the predominate airflow through the rack mount enclosures needs to be from front to back in order to achieve the best cooling performance. However, some rack-mounted equipment exhausts all or a portion of the cooling air through the sides of the chassis. This is particularly true of equipment having a large number of connections (ports) on the front or rear panel of the chassis. The side-exhausting equipment presents problems when the intended installation location is a conventional rack with front and rear airflow, particularly if a hot aisle/cold aisle arrangement is being used. The present invention solves this problem.

BRIEF SUMMARY OF THE INVENTION

A cooling system according to the present invention may comprise a rack-mountable apparatus for redirecting warm air which is exhausted from the side of an equipment chassis such that the warm air can exit from the rear of the rack-mount enclosure.

In one particular preferred embodiment, an air duct is provided between the top rail (or slide) of a chassis mount and the bottom rail thereof. A box-shaped plenum mounted between the lower rails has openings on its back surface and at least one side surface and is in fluid communication with the side-mounted air duct. Warm exhaust air exiting the side of the chassis enters the air duct and is channeled into the plenum which redirects the warm air to an exit at the rear of the enclosure. For the purposes of this disclosure, the cooling air intake side of an enclosure or a chassis (the side facing a "cold aisle") is denominated the "front side" thereof and the opposing, warm air exhaust side (facing a "hot aisle") is the "back" or "rear side."

BRIEF DESCRIPTION OF THE SEVERAL VIEWS OF THE DRAWING(S)

DETAILED DESCRIPTION OF THE INVENTION

Figure 1:
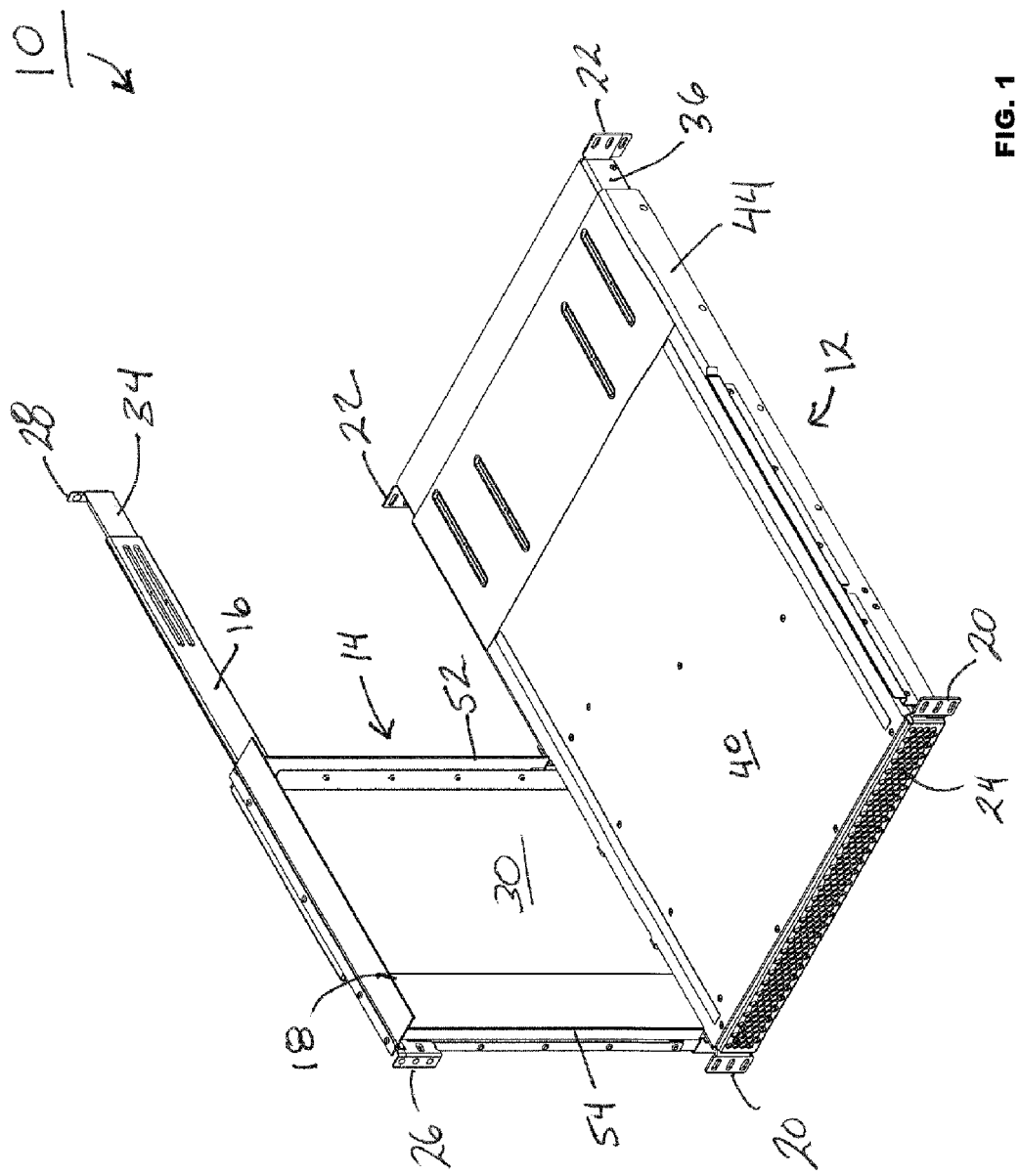
FIG. 1 is a perspective view of the left side of one embodiment of the invention.

The invention may best be understood by reference to one, particular, illustrative embodiment which is shown in the drawing figures.

Figure 2:
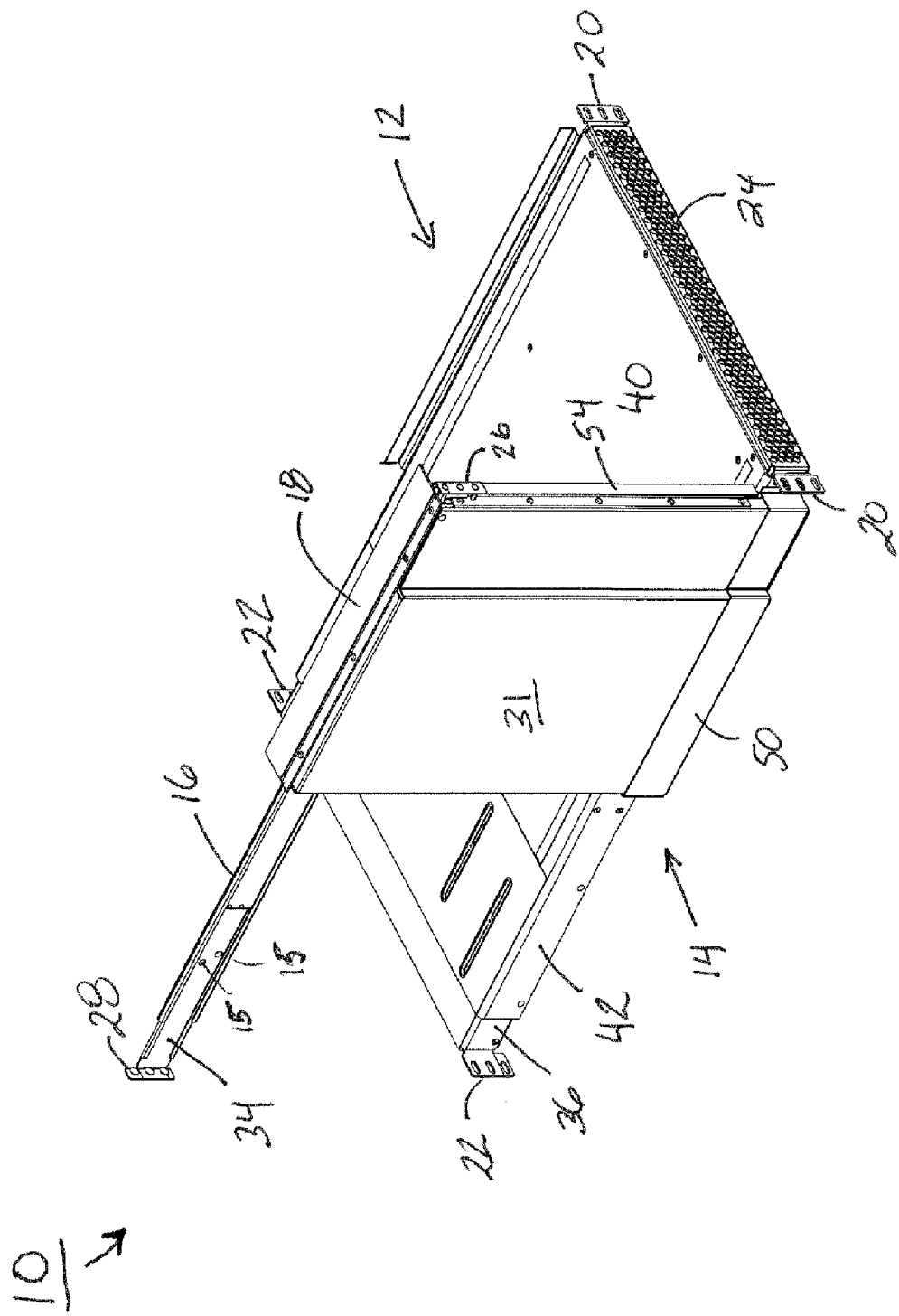
FIG. 2 is a perspective view of the right side of the embodiment shown in FIG. 1.

Referring to FIGS. 1 and 2, a side-exhaust cooling system 10 may comprise exhaust shelf 12, side duct 14 and top rail 16. Exhaust shelf 12 may be a box-like structure comprising six sides—top surface 40, an opposing bottom surface (not shown), a right side panel 42, an opposing left side panel 44, a front panel (not shown) and an opposing rear panel comprised of grill 24 for exhausting warm air towards the back of a rack-mount enclosure in which cooling system 10 is mounted. Exhaust shelf 12 may comprise sliding extension 36 which telescopically extends from the front side of exhaust shelf 12 to accommodate mounting in rack mount enclosures of varying depth.

For rack mounting, exhaust shelf 12 may comprise rear mounting tabs 20 and front mounting tabs 22.

Top rail 16 is configured to mount between one front rail of a rack mount enclosure and the opposing rear rail of the enclosure. Top rail front mounting tab 28 may be secured to the front rail and rear mounting tab 26 may be secured to the rear rail. Top rail 16 may comprise sliding extension 34 which telescopically extends from the front side of top rail 16 in order to accommodate mounting in rack mount enclosures of varying depth. Screws 15 may be provided to lock extension 34 at a desired point. It will be appreciated by those skilled in the art that a sliding extension may additionally or alternatively be provided in the rear section of top rail 16.

Side duct 14 connects top rail 16 and exhaust shelf 12. Side duct 14 is a generally box-shaped structure open on at least a portion of its inner side. Side duct may comprise top air seal 18, front side air seal 52 and opposing rear side air seal 54 all of which are connected to outer panel 31 to form side duct plenum 30. Side duct 14 may be sized to clear the rack vertical rails and Power Distribution Units (PDUs) installed in the side portions of the rack mount enclosure to be used.

Lower portion 50 of side duct 14 is in fluid communication with the interior of exhaust shelf 12. This may be accomplished by providing one or more openings in right side panel 42 of exhaust shelf 12 (not shown) such that air within side duct plenum 30 may flow into the interior cavity of exhaust shelf 12 and exit through vent grill 24 thereby maintaining the desired front-to-back cooling airflow pattern within an enclosure notwithstanding a side air exhaust from a chassis mounted on shelf 12.

The components of cooling system 10 may be constructed of any suitable material. Stamped sheet metal is one, particular preferred material. It is not necessary that all components comprising cooling system 10 be fabricated of the same material. By way of example, top rail 16 and exhaust shelf 12 may be formed of sheet metal while side duct 14 may be thermoformed plastic or composite material.

Figure 3:
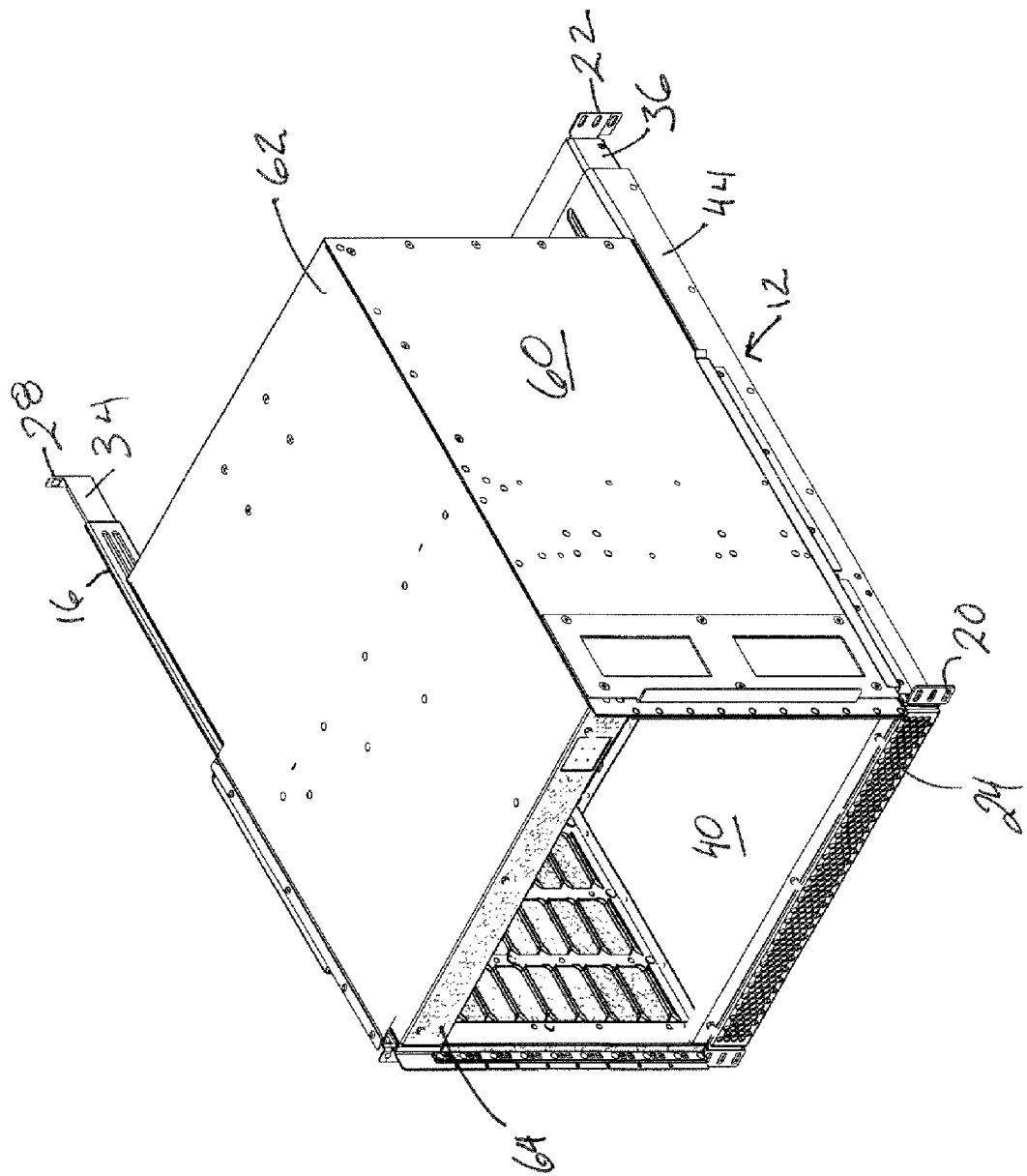
FIG. 3 is a perspective view of the left side of the embodiment shown in FIG. 1 installed on a rack mountable equipment chassis.
Figure 4:
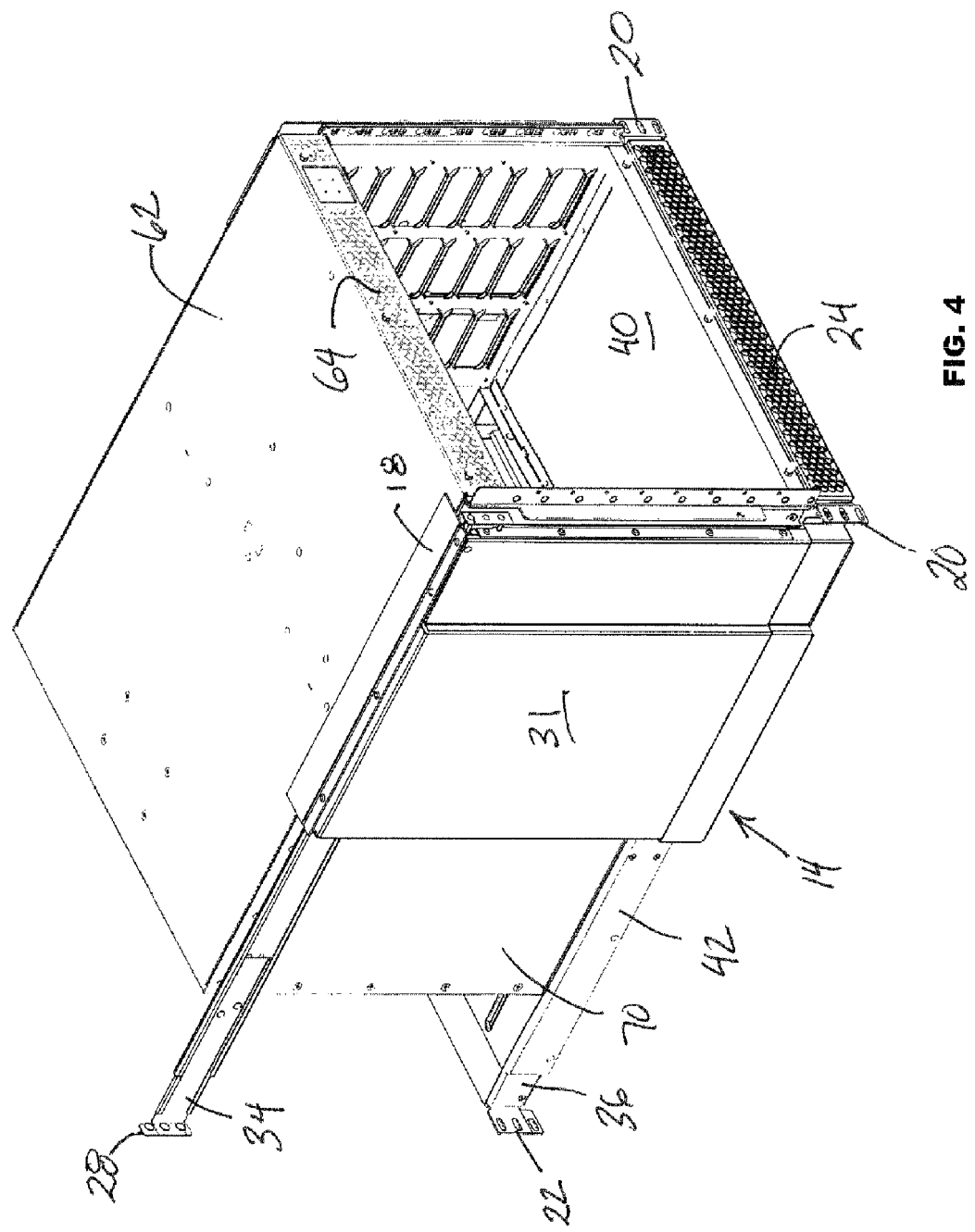
FIG. 4 is a perspective view of the right side of the embodiment shown in FIG. 1 installed on a rack mountable equipment chassis.

FIG. 3 shows cooling system 10 installed on an empty chassis 60. Chassis 60 comprises integral, top exhaust plenum 62 having exhaust vent 64. Chassis 60 may be equipped with mounting flanges for conventional 4-rail rack mounting. Alternatively, chassis 60 may be supported entirely on exhaust shelf 12.

Chassis 60 may comprise fans or blowers (not shown) configured to move air into duct 14 and exhaust through the upper portion of chassis 60 out through vent 64 in addition to shelf 12 and out through vent 24. As is well-known in the art, air within chassis 60, heated by contact with power-dissipating electrical equipment, tends to rise due to convention. This heated air enters duct 14 and then exhaust plenum 62 and is fan-forced out of the chassis through grill 64, in addition to entering shelf 12 and through grill 24.

Chassis 60 may contain equipment which has a fan-forced exhaust from an opening in that portion of side 70 of chassis 60 which is adjacent to side duct 14. This exhaust air collects in plenum 60 and is pushed by the positive pressure of the cooling fans within chassis 60 into exhaust shelf 12 and out grill 24. Alternatively and/or additionally, one or more openings in top rail 16 may align with corresponding openings in side 70 of chassis 60 such that air within top vent 62 can enter plenum 30 (due to positive pressure within vent 62) and be exhausted through exhaust shelf 12.

It will be appreciated that the size and front-to-back location of side duct 12 may be selected to correspond to the size and location of the side exhaust openings in panel 70 of chassis 60.

In certain embodiments of the invention, exhaust shelf 12 may comprise one or more fans or blowers to enhance the air flow out of grill 24. Fans may be mounted in the front panel of exhaust shelf 12 and/or in or adjacent grill 24 in the rear panel of shelf 12. Blowers may be mounted in the interior of exhaust shelf 12.

In yet other embodiments, side duct 14 may be fitted to the left side of exhaust shelf 12 (rather than on the right side as in the illustrated embodiment). In some embodiments, a plurality of side ducts 14 may be fitted to the right, left or both sides of exhaust shelf 12.

In some embodiments of the invention, the airflow may be in the reverse direction—i.e., cooling air may be drawn into the shelf, pass through the side duct and enter the chassis.

Although the invention has been described in detail with reference to certain preferred embodiments, variations and modifications exist within the scope and spirit of the invention as described and defined in the following claims.

What is claimed is:

1. A cooling system comprising:
 a generally box-shaped exhaust shelf configured for mounting in a rack mount enclosure, generally adjacent a parallelepiped chassis having a height, a width and a depth, the exhaust shelf comprising a top panel, an opposing bottom panel spaced apart from the top panel to define an interior space, a first side panel, an opposing second side panel having at least one opening, a front panel having at least one vent therein, and a rear panel having at least one vent therein;
 a top rail adapted for mounting in the rack mount enclosure at a rack position that is remote from, above and generally parallel to the second side of the exhaust shelf; and,
 a side duct having an outer panel, a bottom panel, a front panel and a rear panel which panels define an interior plenum open towards the side of the duct opposite the outer panel thereof, the duct connected between the top rail and the second side panel of the exhaust shelf and in fluid communication with the interior of the exhaust shelf such that air within the plenum may move from the side duct into the interior space of the exhaust shelf and out through the at least one vent in the front panel and the at least one vent in the rear panel of the exhaust shelf and wherein the side duct is sized such that the distance between the top of the top rail and the top panel of the exhaust shelf does not exceed the height of the chassis.

2. A cooling system as recited in claim 1 further comprising a top air seal attached to the top rail above the side duct and generally orthogonal to the side panels and outer panel of the side duct.

3. A cooling system as recited in claim 1 wherein the exhaust shelf comprises a telescopically extendable section adapted to permit adjustment of the length of the exhaust shelf.

4. A cooling system as recited in claim 1 wherein the top rail comprises a telescopically extendable section adapted to permit adjustment of the length of the top rail.

5. A cooling system as recited in claim 1 wherein the side duct comprises a first section having a first depth and a second section having a second depth.

6. A cooling system as recited in claim 1 further comprising opposing mounting flanges on the front and rear panels of the exhaust shelf, said mounting flanges sized and spaced to permit rack mounting of the exhaust shelf.

7. A cooling system as recited in claim 1 wherein the side duct is formed of a thermoplastic material.

8. A cooling system as recited in claim 1 wherein the side duct is formed of a composite material.

9. A cooling system as recited in claim 1 wherein the side duct is formed of sheet metal.

10. An air-cooled, rack-mount chassis for electronic equipment comprising:
 a generally box-shaped enclosure having a height, a width and a depth, a first side panel with at least one opening therein, an opposing, second side panel and opposing top and bottom panels connecting the side panels;
 a generally box-shaped exhaust shelf comprising a top panel connected to the bottom panel of the enclosure, an opposing bottom panel spaced apart from the top panel to define an interior space, a first side panel, an opposing second side panel having at least one opening, a front panel, and a rear panel having at least one vent therein;
 a top rail adapted for mounting in a rack mount enclosure at a rack position that is remote from, above and generally parallel to the second side of the exhaust shelf;
 a side duct having an outer panel, a bottom panel, a front panel and a rear panel which panels define an interior plenum open towards the side of the duct opposite the outer panel thereof, the duct connected between the top rail and the second side panel of the exhaust shelf such that the distance between the top of the top rail and the top panel of the exhaust shelf does not exceed the height of the box-shaped enclosure, the duct being in fluid communication with the at least one opening in the first side panel of the enclosure and the interior of the exhaust shelf such that air from within the enclosure may move into the plenum of the side duct and from the plenum of the side duct into the interior space of the exhaust shelf and out through the at least one vent in the rear panel of the exhaust shelf.

11. A rack-mount chassis as recited in claim 10 further comprising a top air seal attached to the top rail above the side duct and generally orthogonal to the side panels and outer panel of the side duct such that it substantially seals between the top of the enclosure and the side duct.

12. A rack-mount chassis as recited in claim 10 wherein the exhaust shelf comprises a telescopically extendable section adapted to permit adjustment of the length of the exhaust shelf.

13. A rack-mount chassis as recited in claim 10 wherein the top rail comprises a telescopically extendable section adapted to permit adjustment of the length of the top rail.

14. A rack-mount chassis as recited in claim 10 wherein the side duct comprises a first section having a first depth and a second section having a second depth.

15. A rack-mount chassis as recited in claim 10 further comprising at least one mounting flange on the front panel of the exhaust shelf and at least one opposing mounting flange on the rear panel of the exhaust shelf, said mounting flanges sized and spaced to permit rack mounting of the exhaust shelf.

16. A rack-mount chassis as recited in claim 10 further comprising an air duct within the top panel of the enclosure which is in fluid communication with the side duct.

17. A rack-mount chassis as recited in claim 16 further comprising at least one fan in the chassis adapted to move air from the box-shaped enclosure into the side duct.

* * * * *